United States Patent [19]

Nakamura et al.

[11] Patent Number: 5,723,262
[45] Date of Patent: Mar. 3, 1998

[54] RESIN COMPOSITION

[75] Inventors: Shigeo Nakamura; Masahiko Oshimura; Kenichi Mori; Tadahiko Yokota; Hiroyasu Koto, all of Kawasaki, Japan

[73] Assignee: Ajinomoto Co., Inc., Tokyo, Japan

[21] Appl. No.: 680,551

[22] Filed: Jul. 9, 1996

Related U.S. Application Data

[63] Continuation of Ser. No. 255,935, Jun. 7, 1994, abandoned.

[30] Foreign Application Priority Data

Jun. 7, 1993 [JP] Japan ..................... 5-135892
May 16, 1994 [JP] Japan ..................... 6-100903

[51] Int. Cl.$^6$ .................................. G03F 7/038
[52] U.S. Cl. ..................... 430/286.1; 525/502
[58] Field of Search .................. 430/270, 270.1, 430/281.1, 286.1; 525/502

[56] References Cited

U.S. PATENT DOCUMENTS 4,975,347  12/1990  Ahne et al. ..................... 430/18

FOREIGN PATENT DOCUMENTS 1 523 846  9/1978  United Kingdom.
2 175 908  12/1986  United Kingdom.

OTHER PUBLICATIONS

Database WPI, Derwent Publications, AN 91-011785/02, JP-A-02 285 354, Nov. 22, 1990

Database WPI, Derwent Publications, AN 91-175166/24, JP-A-03 106 925, May 7, 1991.

*Primary Examiner*—Kathleen Duda
*Attorney, Agent, or Firm*—Oblon, Spivak, McClelland, Maier & Neustadt, P.C.

[57]  ABSTRACT

An alkali soluble resin and a resin composition thereof useful as a solder resist, having good adhesive properties, solder heat resistance, and plating resistance are provided. Particular resistance to plating under alkaline conditions is provided by the invention.

6 Claims, No Drawings

RESIN COMPOSITION

This application is a Continuation of application Ser. No. 08/255,935, filed on Jun. 7, 1994, now abandoned.

BACKGROUND OF THE INVENTION

1. Field of the Invention

The present invention relates to a new resin, and to a new resin composition which is useful as a solder resist.

2. Description of the Related Art

A solder resist is used for the purpose of protecting a circuit on a printed wiring board and for preventing a solder from being adhered on an irrelevant part during the soldering of parts on the board, and is required to have various characteristics including adhesive properties, electric insulation properties, solder heat resistance, solvent resistance, alkali resistance, acid resistance, plating resistance and the like.

In its earlier stages, solder resists of a thermosetting type were used, such as an epoxy melamine; however, these products had problems of inferior solder heat resistance, insufficient chemical resistance and poor plating resistance, and they were modified to provide a solder resist of an epoxy resin type. One of such examples is disclosed in Japanese Patent Publication Number Sho 51-14044, and this has been mainly used for a printed wiring board in industrial use. For consumer products, since productivity is highly valued, the main material used has been a fast-setting, ultraviolet curing type product, such as the one disclosed in Japanese Patent Publication Number Sho 61-48800, for example. However, the ultraviolet curing type product has a problem of insufficient inner hardening for providing a thick film, and has inferior solder heat resistance as well, and thus cannot be used for industrial printed wiring boards. These materials use screen printing process for formation of a solder resist pattern, but they bleed or embed among the circuit in order to form a solder resist pattern which can cope with high-density printed wiring boards and surface mounting of the parts required by recent miniaturized electronics devices, and they are generally insufficient to fulfill the function of a solder resist film.

A dry film type photo solder resist or a liquid photo solder resist has been developed. A dry film type solder resist is disclosed in Japanese Patent Laid-Open Sho 57-55914, for example, which is a photocurable resin composition for a dry film, containing urethane di(meth)acrylate, a cyclic polymer compound having a specific glass transition temperature and a sensitizing agent. These dry film type photo solder resists, however, do not have sufficient solder heat resistance nor adhesive properties when used for high density printed wiring boards.

On the other hand, a liquid photo solder resist is disclosed, for example, in British Patent Application Laid-Open GB-2032939A, which is a composition for a photo polymerizable paint, containing a solid or a semi-solid reaction product between a polyepoxide and an ethylenic unsaturated carboxylic acid, an inactive inorganic filler, a photo-polymerization initiator, and a volatile organic solvent. In this case, however, since only an ultraviolet curing component is contained and a thermosetting effect is not employed, it has problems of insufficient adhesive properties to the printed wiring board, inferior solder heat resistance, poor electric insulation properties and the like.

A resin composition for a solder resist ink is disclosed in Japanese Patent Publication Number Hei 122312, containing a reaction product between a phenolic novolac type epoxy resin and an unsaturated monobasic acid, a partially reacted product obtained by reaction between a cresol novolac type epoxy resin and an unsaturated monobasic acid, an organic solvent, a photo-polymerization initiator and an amine type curing agent. In this case, the thermosetting effect is also employed since an epoxy group is left in the molecule. However as the epoxy group remains, the amount of the photocurable group shall be decreased; that results in lowering of ultraviolet curing properties, making it difficult to leave a large amount of epoxy groups and to satisfy the characteristics required for the solder resist. Also, use of a halogen type organic solvent for development is not favorable from the viewpoint of the working environment.

A photo solder resist which can be developed with an alkali aqueous solution is disclosed in Japanese Patent Publication Number Hei 1-54390, which is a composition comprising a reaction product between a novolac type epoxy resin, an unsaturated monobasic acid, and a polybasic acid anhydride, a polyfunctional epoxy resin, a diluent and a photo-polymerization initiator. It is, however, pointed out that this composition also has insufficient plating resistance, poor chemical resistance and so on. There has been no such photo solder resist among currently main stream photo solder resists of the alkali developing type that has sufficient resistance to plating particularly under alkaline conditions, for example, an electroless thick gold plating carried out at pH 13.0–13.6, temperature of 60°–80° C. for 30 minutes or an electroless thin copper plating carried out at pH 12.4–12.6, temperature of 60° C. for 30 minutes and the like.

In addition to the above-mentioned photocurable resin having a carboxyl group, a photocurable resin having a phenolic hydroxyl group is used for a photo resist of the alkali developing type, and is disclosed, for example, in DE 3630954A1, which is a compound produced by the addition reaction of an unsaturated group containing monoisocyanate to a novolac resin, or disclosed in Japanese Patent Laid-Open Sho 63-269147 and Japanese Patent Laid-Open Sho 63-2481152, which is a compound produced by addition reaction of an isocyanate ethyl methacrylate to a polyvinyl phenol polymer. It is, however, difficult to satisfy both photo cross-linking properties and alkali solubility with these photocurable resins, since they are obtained by reacting a polymer having a phenolic hydroxyl group with a compound having one polymerizable double bond and an isocyanate group. Besides, since these photocurable resin compositions do not contain a thermosetting component which can react with the phenolic hydroxyl group; they show particularly inferior moisture resistance and do not have sufficient properties required for a photo solder resist like that which is currently needed to provide high heat resistance and high plating resistance.

OBJECTS OF THE INVENTION

Accordingly, an object of the present invention is to provide a new resin and a new composition that shows the superior characteristics required for a solder resist and has sufficient resistance to plating under alkaline conditions.

Other objects will become apparent upon a further understanding of the invention.

DETAILED DESCRIPTION OF THE PREFERRED EMBODIMENTS

The present invention provides a new resin (component A below having two or more polymerizable double bonds in (2) below) and a new composition (components A and B below) wherein component (A) is an alkali soluble resin obtained by reacting (1) an alkali soluble polymer having a phenolic hydroxyl group (and a preferred number average molecular weight in the range of 300–30,000), and (2) a compound having a) one or more polymerizable double bonds and b) an isocyanate group or an epoxy group in its molecule, at a ratio of isocyanate or epoxy equivalent of compound (2) to hydroxyl equivalent of compound (1) in a range of 0.1–0.8, and component (B) is a compound having one or more functional groups which can react with the phenolic hydroxyl group by the application of heat.

The resin of the present invention obtained by the reaction of compound (2) above having two or more polymerizable double bonds with compound (1) above is a new and unknown photocurable resin having high photo crosslinking properties and good alkali solubility. Each component will be explained illustratively as follows.

Examples of an alkali soluble polymer having a phenolic hydroxyl group useful in the present invention as compound (1) of the component (A) include, for example, a novolac resin (represented by the following general formula

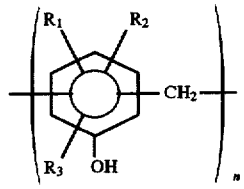

wherein R1, R2 and R3 represent hydrogen, halogen or an alkyl group of 1–5 carbons, and n is an integer of 3–50. Illustrative examples of the novolac resin include phenol novolac resin, cresol novolac resin, ethyl phenol novolac resin, isopropyl phenol novolac resin, tert-butyl phenol novolac resin, 3,5-xylenol novolac resin, bromophenol novolac resin, bisphenol A novolac resin, naphthalene novolac resin and the like. Among these, phenol novolac resin and cresol novolac resin are preferable.

Polyvinyl phenol or its derivatives represented by the following general formula 2 can be also used as the alkali soluble polymer, i.e., compound (1) of component A:

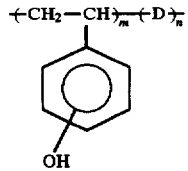

wherein D is a radical polymerizing monomer, m is a positive number, n is 0 or a positive number and $5 \leq m+n \leq 200$, $m/(m+n) \geq 0.5$, and OH is in the para-, ortho or meta a position with respect to the main chain.

Monomer D, which is the copolymerizing component, preferably makes up less than 50 mol % of the polymer, and various compounds having a polymerizing unsaturated bond can be used as monomer D. Examples of monomer D are styrene type monomers such as styrene, α-methyl styrene, (meth)acrylonitrile, (meth)acrylic acid, (meth) acrylic esters such as methyl (meth)acrylate, acrylic monomers such as acrylamide, vinyl ethers such as ethyl vinyl ether, maleic anhydride, vinyl acetate, vinyl pyridine and the like. These polyvinyl phenol type polymers are commercially available, and examples include MARUKALYNCUR-M (poly-p-vinylphenol), LYNCUR-MB (brominated poly-p-vinylphenol), LYNCUR-CMM (p-vinylphenol/methyl methacrylate copolymer), LYNCUR-CHM (p-vinylphenol/2-hydroxyethyl methacrylate copolymer), LYNCUR-CST (p-vinylphenol/styrene copolymer) and the like, produced by Maruzen Petrochemical Co. Two or more kinds of the above-mentioned alkali soluble polymers having a phenolic hydroxyl group can be used in mixture.

Referring to the compound (2) of component A, having a) one, two or more polymerizable double bonds and b) an isocyanate group or an epoxy group in its molecule, the polymerizable double bond includes acrylic groups such as the (meth)acrylate group or (meth)acrylamide group, an allyl group, and various substituted double bonds such as a vinyl ester of a carboxylic acid, vinyl ether, allyl ether and the like; however, particularly preferable is the acrylic group. The compound having one, two or more polymerizable double bonds and an isocyanate group in the molecule includes, for example, (meth)acryloyl isocyanate and isocyanate ethyl (meth)acrylate. Also, a reaction product or a reaction mixture obtained by partial addition reaction of a polyisocyanate compound such as tolylene diisocyanate, hexamethylene diisocyanate, isophorone diisocyanate and their trimer, methylenebisphenyl isocyanate, polymethylene polyphenyl polyisocyanate, with a (meth)acrylate compound which has such a functional group that can react with the isocyanate group, and that can be represented by a hydroxyl group, such as 2-hydroxyl ethyl (meth)acrylate, N-methylol acrylamide, glyceroldi-(meth)acrylate, penta erythritol tri(meth)acrylate, dipenta erythritol penta(meth) acrylate, and bis((meth)acryloxyethyl) hydroxyethyl isocyanurate is included. The synthesis can be carried out according to any known method wherein the (meth)acrylate compound and the polyisocyanate compound are mixed in a solvent such as a hydrocarbon, an ether or an ester solvent having no active hydrogen that can react with isocyanate, at a ratio of [hydroxyl group equivalent in the (meth)acrylate compound/isocyanate equivalent in the polyisocyanate compound)] (wherein n ($n \geq 2$) isocyanate groups are contained in one molecule), of $(1-/n) \pm 0.1$, and subjected to the reaction at a reaction temperature of 40°–100° C., using a tertiary amine or an organic tin compound as a catalyst. Particularly when a monohydroxy polyfunctional (meth) acrylate compound is used, an alkali soluble resin having high photo cross-linking properties can be synthesized.

A compound having one, two or more polymerizable double bonds and an epoxy group in the molecule includes, for example, glycidyl (meth)acrylate, a glycidyl ester of an unsaturated fatty acid such as cinnamic acid, KANEKA RESIN AXE (produced by Kanegafuchi Chemical Industry Co., Ltd.), CYCLOMER A-200, M-200 (produced by Daicel Chemical Industries, Ltd.). A reaction product of hydroxy alkyl (meth)acrylate, polycarboxylic acid anhydride and epihalohydrin, disclosed in Japanese Patent Laid-open Sho 50-59315, incorporated herein by reference, can be used as well. Also, a reaction product or a reaction mixture obtained by addition of a monocarboxylic acid containing an unsaturated group, such as (meth)acrylic acid to a polyfunctional epoxy compound (having n ($n \geq 2$) epoxy groups in the molecule) at a rate [acid equivalent/epoxy equivalent] of $(1-1/n) \pm 0.1$, can be used as well. The reaction can be carried out in an appropriate organic solvent, by adding a small amount of a reaction catalyst such as a tertiary amine and a polymerization inhibitor, at the reaction temperature of 70°–120° C. Particularly when an epoxy compound having three or more functional groups is used, an alkali soluble resin having high photo cross-linking properties can be synthesized.

The above-mentioned compound having a) one, two or more polymerizable double bonds and b) an isocyanate group or an epoxy group in the molecule can be used alone, or in mixture with one or more such compounds and added to the alkali soluble polymer represented by the above-mentioned general formula 1 or 2 to synthesize an alkali soluble resin, which is the component (A) provided that the ratio of [isocyanate or epoxy equivalent/hydroxyl group equivalent of the alkali soluble polymer] is controlled to be in a range of 0.1–0.8. Mixtures of the above compounds can be used as long as the total isocyanate plus epoxy equivalent is kept within this range. The hydroxyl group includes the functional group produced by reacting an epoxy group with a phenolic hydroxy group. When this ratio is below 0.1, the product shows low photocuring properties to lose the exposed part during the development, while, when the ratio is over 0.8, the product shows extremely deteriorated developing capability in the aqueous alkali solution.

For synthesizing component (A), a solvent is preferably used. Examples of the solvent include ketones such as methyl ethyl ketone, glycol ethers such as methyl cellosolve, methyl carbitol, triethylene glycol monoethyl ether, esters such as ethyl acetate and acetic esterified products of above-mentioned glycol ethers, and petroleum origin solvents such as petroleum naphtha and solvent naphtha. The above-mentioned solvent is used alone or in mixture with one or more such compounds, and an appropriate amount of the solvent to be used is 10–300 parts by weight, preferably 30–200 parts by weight with respect to 100 parts by weight of the alkali soluble polymer, the compound (1) of the component (A). In order to accelerate the reaction, it is preferable to add a small amount of a catalyst. For the reaction between the isocyanate group and the hydroxyl group, a urethane forming catalyst such as dibutyl tin dilaurate, a tertiary amine and the like, for the reaction between the epoxy group and the hydroxyl group, triethyl amine, dimethyl benzyl amine, tetraethyl ammonium bromide, triphenyl phosphine and the like are preferably used. The amount of the catalyst to be used is 0.1–10% chemical equivalent, preferably 1–5% chemical equivalent with respect to 1 chemical equivalent of the isocyanate or the epoxy group. For preventing the polymerization during the reaction, a polymerization inhibitor such as hydroquinone, phenothiazine, hydroquinone monomethyl ether and the like are preferably used and the amount the polymerization inhibitor to be used is 0.01–1% by weight, preferably 0.05–0.5% by weight, based on the reaction mixture. The reaction temperature is 40°–150° C., preferably 50°–110° C. When a compound having an isocyanate group is used, it is desirable to inactivate the remaining isocyanate group with a monohydric alcohol such as methanol or ethanol after the reaction, from the viewpoint of safety and improving storing stability.

Component (B) of the resin composition of the present invention, which is a compound having one or more functional groups which can react with a phenolic hydroxyl group on heating, is blended for the purpose of thermosetting. The functional groups include the epoxy group, the isocyanate group, the methylol group, the oxazoline group and the like, but particularly preferable is the epoxy group. Useful compounds having one or more epoxy groups include, for example, epoxy resins such as phenol novolac type epoxy resin, cresol novolac type epoxy resin, bisphenol-A type epoxy resin, bisphenol-F type epoxy resin, bisphenol-S type epoxy resin, N-glycidyl type epoxy resin, an alicyclic epoxy resin, phenyl glycidyl ether, triglycidyl isocyanurate and glycidyl methacrylate. A thermosetting resin to be used as component (B) in addition to the epoxy compound, includes block polyisocyanate, an amino resin having such an active group as methylol group, and oxazoline compound such as phenylene bisoxazoline and the like. These compounds can be used alone, or two or more of these compounds can be used in mixture. Though it is not directly reacted with the phenolic hydroxyl group, a thermosetting resin such as resol type phenolic resin, xylene resin and polyurethane and the like which can be crosslinked with heat, can be also added and used.

The blending ratio of the component (B) in the resin composition of the present invention is 10–200 parts by weight, preferably 20–120 parts by weight with respect to 100 parts by weight of the component (A), which is the alkali soluble resin. A curing agent or an accelerator of curing for the component (B) of 1–20 parts by weight can be added to 100 parts by weight of the component (B). Illustrative examples include, dicyan diamide or its modified substance, amine compounds, imidazole compounds, polybasic acid hydrazides, carboxylic acid compounds, phenols, quaternary ammonium salts, quaternary phosphonium salts, phosphines and their epoxy adducts and the like.

Not only known and conventionally used thermal radical generating agents including peroxides such as benzoyl peroxide, azo compounds such as azobis-isobutylonitrile, are added to the resin composition of the present invention to carry out heat polymerization, but also photocurability can be imparted by adding a photopolymerization initiator. The photopolymerization initiator reacts with component (A) or with a photopolymerizable monomer to be blended if necessary, which will be described later, to initiate the polymerization. The photopolymerization initiator includes benzoins such as benzoin, benzyl, benzoin methyl ether, benzoin isopropyl ether, benzoin alkyl ethers, acetophenones such as acetophenone, 2,2dimethoxy-2-phenylacetophenone, 2,2-diethoxy-2phenylacetophenone, 1,1-dichloroacetophenone, 1hydroxycyclohexyl phenylketone, 2-methyl-1-[4(methylthio)phenyl]-2-morphono-propane-1-one, N,N-dimethylamino acetophenone, anthraquinones such as 2-methyl anthraquinone, 2-ethyl anthraquinone, 2-tert-butyl anthraquinone, 1-chloroanthraquinone, 2-amylanthraquinone, 2-aminoanthraquinone, thioxantons such as 2,4-dimethyl thioxanton, 2,4-diethyl thioxanton, 2-chlorothioxantone, 2,4-diisopropyl thioxanton, ketals such as acetophenone dimethyl ketal, benzyl dimethyl ketal, benzophenones such as benzophenone, methyl benzophenone, 4,4'-dichlorobenzophenone, 4,4'-bisdiethyl amino benzophenone, Michler's ketone, and xantones and the like. The photopolymerization initiator can be used alone or two or more kinds of the photopolymerization initiator can be mixed and used.

As the photopolymerization initiator, a known and conventionally used compound such as benzoates including ethyl-4-dimethylamino benzoate, 2(dimethylamino)ethyl benzoate and the like, and tertiary amines including triethyl amine and triethanol amine and the like can be also used alone or in mixture or two or more kinds. An appropriate amount of the photopolymerization initiator to be used is 0.2–25% by weight, preferably 2–10% by weight of the composition. An amount less than this range results in inferior sensitivity, and an amount of over this range does not improve the photocurability and thus is not preferable.

If necessary, a photopolymerizable vinyl monomer can be added to the resin composition of the present invention as a diluent. A representative example of the photopolymerizable vinyl monomer includes, hydroxyl alkyl acrylates such as 2-hydroxy ethyl acrylate and 2-hydroxy butyl acrylate, mono or diacrylates of glycol such as ethylene glycol, methoxy tetraethylene glycol, polyethylene glycol, propylene glycol, acrylamides such as N,N-dimethyl acryl amide, N-methylol acrylamide, amino alkyl acrylates such as N,N-dimethyl amino ethyl acrylate, polyhydric alcohol such as trimethylol propane, pentaerythritol, dipentaerythritol, or polyhydric acrylates such as ethylene oxide adducts, propylene oxide adducts or e-caplolactone adducts of these polyhydric alcohols, phenols such as phenoxy acrylate, phenoxy ethyl acrylate or acrylates such as ethylene oxide adducts or propylene oxide adducts of these phenols, epoxy acrylates derived from glycidyl ethers such as trimethylolpropane triglycidyl ether, melamine acrylates and/or methacrylate corresponding to the above-mentioned acrylates. As the diluent, two or more kinds of these compounds can be used in a mixture as well, and an appropriate amount of the diluent to be used is 1–50% by weight of the composition.

According to the present invention, a known and conventionally used additive can be added and used in addition to the above-mentioned components. For example, a known and conventionally used inorganic filler, such as barium sulfate, barium titanate, silicon oxide powder, pulverized silicon oxide, amorphous silica, talc, clay, magnesium carbonate, calcium carbonate, aluminum oxide, aluminum hydroxide and mica powder can be used, and the blending ratio is 0–100% by weight, preferably 5–60% by weight of the resin composition. Furthermore, if necessary, a known and conventionally used additive including a coloring agent such as phthalocyanine blue, phthalocyanine green, iodine green, disazoyellow, crystal violet, titanium oxide, carbon black, naphthalene black and the like, a known and conventionally used heat polymerization inhibitor such as hydroquinone, hydroquinone monomethyl ether, phenothiazine, a known and conventionally used thickening agent such as asbestos, bentonite and the like, defoaming agent of silicone type, fluorine type and polymer type and/or leveling agent, adhesive property imparting agent of imidazole type, thiazole type, triazole type and silane coupling agent and the like can be used.

Such a solder resist composition is coated, for example, on a printed wiring board wherein a circuit is formed, by such a process as screen printing, or by overall coating using curtain coater, spin coater, or spaying. In a case of a photo solder resist composition, the coat is then directly irradiated with a laser beam or selectively exposed to an actinic rays from a high-pressure mercury-vapor lamp and a metal halide lamp, through a photomask having a pattern, and the non-exposed part is developed with a developer to form a pattern. After forming the pattern, heat treatment is carried out at 100°–200° C. to produce a permanent protection film having satisfactory characteristics required for a solder resist. The overall properties can be further improved by carrying out exposure to the actinic ray following the heat treatment.

The developer used for forming the solder resist pattern, after exposing the photo solder resist composition to the light, can be an aqueous solution of an alkali such as sodium hydroxide, potassium hydroxide, tetramethyl ammonium hydroxide. An organic solvent such as methyl ethyl ketone, methyl cellosolve, cyclohexanone and the like can be used as well, however, an alkali aqueous solution is more desirable from the viewpoint of the working environment. The solder resist composition of the present invention can also be washed with the above-mentioned alkali aqueous solution from the instruments used for coating the ink.

The composition of the present invention is particularly useful as a solder resist composition, however, it can be also used for an insulating material, a surface coating agent, a paint and an adhesive agent and the like.

To further illustrate this invention, and not by way of limitation, the following examples, embodiments and reference examples are given. Unless otherwise stated, the terms "parts" and "%" are all based on the weight.

EXAMPLE 1

165 parts of 2,4-tolylene diisocyanate and 300 parts of carbitol acetate were put in a three-necked flask having a stirrer and a cooler, and heated at 60° C. for 0.5 hours with stirring. Then at the same temperature, a solution containing 395 parts of pentaerythritol triacrylate (ARONIX M-305, produced by Toagosei Chemical Industry Co., Ltd.), 150 parts of solvent naphtha, 2 parts of dibutyl tin dilaurate and 0.5 parts of hydroquinone monomethyl ether was added to it dropwise over about 0.5 hours, and the solution was further stirred for 1.5 hours. The reaction product, together with i part of dibutyl tin dilaurate was added to a three-necked flask having a cooler wherein 400 parts of poly-p-vinylphenol (MARUKALYNCUR-M, S-2P) and 400 parts of carbitol acetate were previously heated at 65° C. for 2 hours under stirring, and the solution was stirred and reacted at the same temperature for 12 hours. After that, the reaction mixture was cooled to 60° C. and 13 parts of ethanol was added and reacted with stirring for 1 hour to obtain a resin solution (nonvolatile content of about 53%) as resin 1.

EXAMPLE 2

190 parts of isophorone diisocyanate and 180 parts of carbitol acetate were put in a three-necked flask having a stirrer and a cooler, and heated at 60° C. for 0.5 hours with stirring. Then at the same temperature, a solution containing 360 parts of pentaerythritol triacrylate (ARONIX M-305), 90 parts of solvent naphtha, 2 parts of dibutyl tin dilaurate and 0.5 parts of hydroquinone monomethyl ether was added to it dropwise over about 0.5 hours, and the solution was further stirred for 2 hours. The reaction product, together with 1 part of dibutyl tin dilaurate was added to a three-necked flask having a cooler wherein 500 parts of phenol novolac resin (PHENOLITE TD-2090-P produced by Dainippon Ink and Chemicals, Inc.) and 500 parts of carbitol acetate were previously heated at 65° C. for 2 hours with stirring, and the solution was reacted with stirring at the same temperature for 12 hours. After that, the reaction mixture was cooled to 60° C. and 12 parts of ethanol was added and reacted with stirring for 1 hour to obtain a resin solution (nonvolatile content of about 57%) as resin 2.

EXAMPLE 3

200 parts of cresol novolac resin PHENOLITE VH-4280, produced by Dainippon Ink and Chemicals, Inc.) and 200 parts of carbitol acetate were put in a three-necked flask having a stirrer and a cooler, and heated at 90° C. for 1 hour to be melted. Then at the same temperature, a solution containing 85 parts of glycidyl methacrylate, 10 parts of solvent naphtha, 1 part of triethyl amine and 0.1 parts of hydroquinone monomethyl ether was added to it dropwise, and the solution was reacted with stirring for 4 hours to obtain a resin solution with a nonvolatile content of about 58% as resin 3.

Reference Example 1

200 parts of poly-p-vinylphenol (MARUKALYNCUR-M, S-2P) and 200 parts of carbitol acetate were put in a three-necked flask having a stirrer and a cooler, and heated at 90° C. for 1 hour to be melted. After the mixture was cooled to 65° C., a solution containing 115 parts of isocyanate ethyl methacrylate, 40 parts of solvent naphtha, 2 parts of dibutyl tin dilaurate and 0.1 parts of hydroquinone monomethyl ether was added to it dropwise, and the solution was reacted with stirring for 12 hours. The reaction product was cooled to 60° C., then 4 parts of ethanol was added and reacted with stirring for 1 hour to obtain a resin solution having a nonvolatile content of about 56% as resin 4.

Reference Example 2

1070 parts of cresol novolac type epoxy resin having epoxy equivalent of 214 (EPI CLON N-680 produced by Dainippon Ink and Chemicals Inc.), 620 parts of carbitol acetate, and 300 parts of solvent naphtha were put in a three-necked flask having a stirrer and a cooler, and heated and melted at 90° C. with stirring. Then 400 parts of acrylic acid, 1 part of hydroquinone, 6.8 parts of dimethyl benzylamine were added and reacted with stirring at 110° C. for 24 hours. After the reaction product was cooled to 100° C., 370 parts of tetrahydrophthallic anhydride was added and reacted with stirring for 4 hours to obtain a resin solution having a nonvolatile content of about 65%, having an acid value of 50 mgKOH/g, which can be developed with a dilute alkali solution, as resin 5.

Embodiment 1

| (resin 1) | 75 parts |
| --- | --- |
| cresol novolac type epoxy resin (epoxy equivalent 214) | 35 parts |
| dipenthaerythritol hexaacrylate | 5 parts |
| 2,2'-azobis(isobutylonitrile) | 5 parts |
| dicyan diamide | 2 parts |
| triphenyl phosphine | 1 part |
| barium sulfate | 15 parts |
| silica | 8 parts |
| aerosyl | 2 parts |
| phthalocyanine green | 1 part |
| silicon type defoaming agent | 2 parts |

The above formulation ingredients were preliminarily mixed, then kneaded three times with a three-roll-mill to prepare a resin composition. The resin composition was coated on a printed wiring board by screen printing process, then placed in a hot air circulating furnace which was heated to 150° C. and post curing was carried out for 30 minutes to produce a solder resist pattern.

Embodiment 2

| (resin 1) | 75 parts |
| --- | --- |
| cresol novolac type epoxy resin (epoxy equivalent 214) | 35 parts |
| dipentaerythritol hexaacrylate | 5 parts |
| 2-methyl-1-[4-(methylthio)phenyl]-2-morphono-propane-1-on | 5 parts |
| diethyl thioxanton | 1 parts |
| dicyan diamide | 2 parts |
| triphenyl phosphine | 1 part |
| barium sulfate | 15 parts |
| silica | 8 parts |
| aerosyl | 2 parts |
| phthalocyanine green | 1 part |
| silicon type defoaming agent | 2 parts |

The above formulation ingredients were preliminary mixed, then kneaded three times with a three-roll-mill to prepare a photocurable resin composition. The photocurable resin composition was coated on the whole surface of a printed wiring board by screen printing process, then placed in hot air circulating furnace and heated at 80° C. for 20 minutes for drying then cooled to a room temperature to produce a dry coat. Then a patterned photo mask was contacted on the coat, and it was exposed to the light from a metal halide lamp produced by ORC & Co., Ltd. at 1000 mJ/cm². Then the coat was developed for 1 minute using 2% sodium hydroxide aqueous solution as a developer, and washed with water and dried. Then the coat was placed in a hot air circulating furnace which was heated to 150° C., and post curing was carried out for 30 minutes, then again it was exposed to the light from the same UV irradiator at 1000 mJ/cm² (hereafter called as after-exposure) to produce a solder resist pattern.

Embodiment 3

| (resin 2) | 70 parts |
| --- | --- |
| cresol novolac type epoxy resin (epoxy equivalent 214) | 30 parts |
| dipentaerythritol hexaacrylate | 10 parts |
| 2-methyl-1-[4-(methylthio)phenyl]-2-morphono-propane-1-on | 5 parts |
| diethyl thioxanton | 1 part |
| dicyan diamide | 2 parts |
| triphenyl phosphine | 1 part |
| barium sulfate | 15 parts |
| silica | 8 parts |
| aerosyl | 2 parts |
| phthalocyanine green | 1 part |
| silicon type defoaming agent | 2 parts |

The above formulation ingredients were kneaded, coated, dried and developed, then post curing and after-exposure were carried out in a manner analogous to that of Embodiment 2 to produce a solder resist pattern.

Embodiment 4

| (resin 3) | 70 parts |
| --- | --- |
| cresol novolac type epoxy resin (epoxy equivalent 214) | 30 parts |
| dipentaerythritol hexaacrylate | 10 parts |
| 2-methyl-1-[4-(methylthio)phenyl]-2-morphono-propane-1-on | 5 parts |
| diethyl thioxanton | 1 part |
| dicyan diamide | 2 parts |
| triphenyl phosphine | 1 part |
| barium sulfate | 15 parts |
| talc | 8 parts |
| aerosyl | 2 parts |
| phthalocyanine green | 1 part |
| silicon type defoaming agent | 2 parts |

The above formulation ingredients were kneaded, coated, dried and developed, then post curing and after-exposure were carried out in a manner analogous to that of Embodiment 2 to produce a solder resist pattern.

Reference Embodiment 1

| (resin 4) | 70 parts |
| --- | --- |
| trimethylol propane PO modified triacrylate (ARONIX M-320 produced by Toagosei Chemical Industry Co., Ltd.) | 20 parts |
| 2-methyl-1-[4-(methylthio)phenyl]-2-morphono-propane-1-on | 5 parts |
| diethyl thioxanton | 1 part |

-continued

| | |
|---|---|
| barium sulfate | 15 parts |
| silica | 8 parts |
| aerosyl | 2 parts |
| phthalocyanine green | 1 part |
| silicon type defoaming agent | 2 parts |

The above formulation ingredients were kneaded, coated, dried and developed, then post curing and after-exposure were carried out in a manner analogous to that of Embodiment 2 to produce a solder resist pattern.

Reference Embodiment 2

| | |
|---|---|
| (resin 5) | 60 parts |
| cresol novolac type epoxy resin (epoxy eguivalent 214) | 30 parts |
| dipentaerythritol hexacrylate | 5 parts |
| 2-methyl-1-[4-(methylthio)phenyl]-2-morphono-propane-1-on | 5 parts |
| diethyl thioxanton | 1 part |
| dicyan diamide | 2 parts |
| barium sulfate | 15 parts |
| silica | 8 parts |
| aerosyl | 2 parts |
| phthalocyanine green | 1 part |
| silicon type defoaming agent | 2 parts |

The above formulation ingredients were kneaded, coated, dried and developed, then post curing and after-exposure were carried out in a manner analogous to that of Embodiment 2 to produce a solder resist pattern. A 1% sodium carbonate aqueous solution was used as a developer for this blend.

The properties of the resin compositions for a solder resist and the solder resist patterns obtained in Embodiments 1–4 and Reference Examples of 1–2 were tested and the results are shown in Table 1. The testing process and the evaluation/judgment of each property of Table 1 are described in the following.

TABLE 1

| | Embodiments | | | | Reference Embodiments | |
|---|---|---|---|---|---|---|
| | 1 | 2 | 3 | 4 | 1 | 2 |
| Finger Touch Drying Property | | A | A | A | B | A |
| Developing Property | | A | A | A | A | A |
| Adhesive Property | A | A | A | A | A | A |
| Pencil Hardness | 4H | 4H | 4H | 4H | 4H | 4H |
| Soldering Resistance | A | A | A | A | C | A' |
| Nickel Plating Resistance | A | A | A | A | B | A' |
| Thin Copper Plating Resistance | A | A | A | A | C | C |
| Thick Copper Plating Resistance | A | A | A | A' | C | C |
| Thick Gold Plating Resistance | A | A | A | A' | C | C |

1) Finger touch drying property test

After the photo solder resist composition was printed on a printed wiring board and dried, a finger is pressed on the coat surface to evaluate the surface condition.

A: The surface was not sticky at all
B: The fingerprints remained slightly on the surface.
C: The fingerprints remained markedly on the surface.

2) Developing property test

A test piece was produced from each photo solder resist composition by irradiating it with ultraviolet rays at 1000 mJ/cm$^2$ through a photo mask, and the produced test piece was immersed in a developer while stirring it. Then the condition of the removal of the nonexposed part was visually inspected.

A: The test piece was perfectly developed.
B: The test piece had an undeveloped remaining.
C: The test piece was hardly developed.

3) Adhesive property test

As for the resin composition of Embodiment 1, a test piece was produced by carrying out post curing of the composition at 150° C. for 30 minutes, and as for the other photo solder resist compositions, test pieces were produced by irradiating them with ultraviolet rays at 1000 mJ/cm$^2$ using an integrating actinometer produced by ORC & Co., Ltd. through a photo mask respectively, immersing them in a developer for 1 minute while stirring it, to develop the compositions, carrying out the post curing of the developed compositions at 150° C. for 30 minutes, and exposing them to the light at 1000 mJ/cm$^2$. Those test pieces were cross-cut in a grid pattern, according to the test process of JIS D 0202, then the removal condition was visually observed after carrying out peeling test with cellophane tape.

A: 100/100
B: 50/100–99/100
C: 0/100–49/100

4) Pencil hardness test

The hardness was measured on the same test pieces used for the adhesive property test, according to a testing method of JIS K 5400.

5) Solder resistance test

The same test pieces used for the adhesive property test were immersed in a soldering bath at 260° C. for 15 seconds three times, according to the test process of JIS C 6481, and both the coating condition and the adhesive property were judged and evaluated comprehensively.

A: Absolutely no change was recognized.
A': A very little change was recognized.
B: A remarkable change was recognized.
C: Blistering, or peeling off by swelling was seen in the coat.

6) Nickel plating resistance

The same test pieces used for the adhesive property test were subjected to plating at 85° C. (liquid temperature) for 30 minutes utilizing an electroless nickel plating liquid (ICP Nicolon produced by Okuno Chemical Industries, Ltd.), and the resulting coating conditions were evaluated in the same manner as that of the solder resistance test.

7) Thin copper plating resistance

The same test pieces used for the adhesive property test were subjected to plating at 60° C. (liquid temperature) for 30 minutes utilizing an electroless copper plating liquid (CUST-2000 produced by Hitachi Chemical Co., Ltd., pH 12.4–12.6), and the resulting coating conditions were evaluated in the same manner as that of the solder resistance test.

8) Thick copper plating resistance

The same test pieces used for the adhesive property test were subjected to plating at 72° C. (liquid temperature) for 8 hours utilizing a high-speed electroless thick copper plating liquid (KC-500 produced by Japan Energy Co., pH 12.3–12.7), and the resulting coating conditions were evaluated in the same manner as that of the solder resistance test.

9) Thick gold plating resistance

The same test pieces used for adhesive property test were subjected to plating at 85° C. (liquid temperature) for 15 minutes utilizing an electroless nickel plating liquid (ICP Nicolon produced by Okuno Chemical Industries Co., Ltd.), then subjected to the plating at 90° C. (liquid temperature) for 20 minutes using an electroless thin gold plating liquid (OPC MUDENGOLD AD (pH 5.8) produced by the same company), and further subjected to plating at 73° C. (liquid temperature) for 30 minutes using an electroless thick gold plating liquid (OPC MUDENGOLD AD (pH 13.5) produced by the same company), and the resulting coating conditions were evaluated in the same manner as that of the solder resistance test.

As it is clear from the results in Table 1, the photo solder resist compositions obtained in Embodiments 2–4 show high finger touch drying properties and developing properties, and the solder resist pattern obtained in each Embodiment shows good characteristics including adhesive property, hardness, solder heat resistance, nickel plating resistance, thin copper plating resistance, thick copper plating resistance and thick gold plating resistance. The photosensitive resin composition disclosed in Japanese Patent Laid-Open Sho 63-269147, which does not contain a thermosetting component, just like the Reference Example 1, does not have sufficient properties from the viewpoint of the solder heat resistance and the plating resistance. The photo solder resist composition of dilute alkali solution developing type, disclosed in Japanese Patent Publication Number Hei 1-54390, also shown as the Reference Example 2, comprising a reaction product of a novolac type epoxy resin, an unsaturated monobasic acid and a polybasic acid anhydride, a polyfunctional epoxy resin, a diluent and a photopolymerization initiator, had no resistance at all to plating under alkaline condition since it was even dissolved in such a condition.

As described above, the resin of the present invention allows formation of such a solder resist pattern that has good developing property, adhesive property, solder heat resistance, nickel plating resistance as well as sufficient resistance to plating under alkaline condition, such as copper plating and thick gold plating.

Obviously, numerous modifications and variations of the present invention are possible in light of the above teachings. It is therefore to be understood that within the scope of the appended claims, the invention may be practiced otherwise than as specifically described herein.

This application claims benefit of priority to Japan 135892/1993 filed Jun. 7, 1993 and Japan 100903/1994, filed May 16, 1994, both incorporated herein by reference.

What is claimed as new and desired to be secured by Letters Patent of the United States is:

1. A resin composition, comprising:
    A) 1) an alkali soluble polymer having a phenolic hydroxy group and a number average molecular weight in the range of from 300 to 30,000, and 2) a compound having a) two or more polymerizable double bonds and b) an isocyanate group or an epoxy group in its molecule,
    wherein the ratio of isocyanate or epoxy equivalent of compound 2) to hydroxyl equivalent of compound 1) is in the range of from 0.1 to 0.8; and
    B), a compound having one or more functional groups which can react with the phenolic hydroxyl group by application of heat.

2. The resin composition according to claim 1 wherein the alkali soluble polymer having the phenolic hydroxyl group is a polyvinyl phenol.

3. The resin composition according to claim 1 wherein the alkali soluble polymer having the phenolic hydroxyl group is a phenol novolac resin.

4. The resin composition according to claim 1 wherein the resin composition is a solder resist composition.

5. The resin composition according to claim 1, wherein the two or more polymerizable double bonds in the compound (2) is each contained in an acrylic group.

6. A resin composition, comprising
    A), an alkali soluble resin obtained reacting 1) an alkali soluble polymer having a phenolic hydroxyl group and a number average molecular weight in the range of from 300 to 30,000 and 2) a compound having a) a polymerizable double bond and b) an isocyanate group or an epoxy group in its molecule,
    wherein the ratio of isocyanate or epoxy equivalent of compound 2) to hydroxyl equivalent of compound 1) is in the range of from 0.1 to 0.8; and
    B), a compound having one or more functional groups which can react with the phenolic hydroxyl group by application of heat.

* * * * *